United States Patent
Shitagami et al.

(10) Patent No.: US 7,323,817 B2
(45) Date of Patent: Jan. 29, 2008

(54) ORGANIC ELECTROLUMINESCENT DEVICE AND ELECTRONIC APPARATUS

(75) Inventors: Kozo Shitagami, Suwa (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 445 days.

(21) Appl. No.: 11/042,139

(22) Filed: Jan. 26, 2005

(65) Prior Publication Data
US 2005/0179377 A1 Aug. 18, 2005

(30) Foreign Application Priority Data
Feb. 18, 2004 (JP) ............................. 2004-041465

(51) Int. Cl.
*H01J 33/00* (2006.01)
(52) U.S. Cl. ..................... 313/512; 313/504; 313/506
(58) Field of Classification Search ..................... None
See application file for complete search history.

(56) References Cited

U.S. PATENT DOCUMENTS

| 6,194,837 | B1 | 2/2001 | Ozawa |
| 6,933,671 | B2 | 8/2005 | Nakanishi |
| 7,119,409 | B2 * | 10/2006 | Kawamura et al. ......... 257/414 |
| 2002/0037430 | A1 * | 3/2002 | Takeishi et al. ........... 428/690 |
| 2006/0202613 | A1 * | 9/2006 | Kawaguchi et al. ........ 313/506 |

FOREIGN PATENT DOCUMENTS

| JP | A-11-024604 | 1/1999 |
| JP | A-2003-248442 | 9/2003 |
| KR | 2003-44665 | 6/2003 |

* cited by examiner

*Primary Examiner*—Ashok Patel
(74) *Attorney, Agent, or Firm*—Oliff & Berridge, PLC (57) ABSTRACT

To provide an organic electroluminescent device which has a sealing structure including a casing and/or a sealing layer and which can be manufactured with high yield in such a manner that electrodes and other components are effectively prevented from being damaged due to stresses caused by the sealing layer and/or the electrodes. An organic electroluminescent device includes a substrate, a plurality of first electrodes, a partition structure having a plurality of openings located at positions corresponding to the first electrodes, organic functional layers each placed in the corresponding openings, a second electrode disposed over the partition structure and the organic functional layers, a sealing layer disposed over the second electrode, and a protective substrate, those components being disposed on or above the substrate. The organic electroluminescent device has a stress relief structure including a plurality of island-shaped members arranged along at least one part of outer ends of the partition structure.

17 Claims, 6 Drawing Sheets

ORGANIC ELECTROLUMINESCENT DEVICE AND ELECTRONIC APPARATUS

BACKGROUND

The present invention relates an electroluminescent device and an electronic apparatus.

In recent years, organic electroluminescent devices (organic EL devices) including organic electroluminescent elements (organic EL elements), referred to as self-emitting elements, including no backlights or the like, have been attracting much attention. The organic EL elements include organic functional layers, that is, light-emitting layers, each placed corresponding anodes and a cathode facing each other. For the organic functional layers, since a material for forming the organic functional layers can be provided on desired positions in a predetermined amount by a droplet ejection process, the following technique has been proposed: a technique for forming the organic functional layers using a polymer that is suitable for such a droplet ejection process. For example, Patent Document 1 discloses a technique in which pixel regions for forming the organic functional layers are each surrounded by corresponding partitions in advance and the polymer is then provided on the regions surrounded by the partitions, whereby the organic functional layers are formed.

[Patent Document 1] Japanese Unexamined Patent Application Publication No. 11-24604.

SUMMARY

In an electro-optical field including an organic EL device, it is critical to enhance resistance to oxygen, moisture, and the like. Therefore, in order to prevent the entry of oxygen, moisture, and the like, the organic EL device has a configuration in which organic EL elements are arranged on a substrate and shielded from the atmosphere with a casing (sealing cap or the like) or a sealing layer.

In such a configuration, an electrically conductive layer functioning as a cathode usually lies over partitions. Different stresses are applied to a section of the cathode disposed over the partitions (that is, over a display region) and other sections of the cathode disposed on regions other than the display region. Therefore, the cathode is vulnerable to cracking, which can cause electrical discontinuity in the cathode in some cases. In particular, when the sealing layer lies over the cathode, the cathode is vulnerable to damage, thereby causing a reduction in yield. This is because portions of the cathode suffer from stresses, due to steps between the partitions, applied from a material for forming the sealing layer when the sealing layer-forming material that is liquid is applied onto the cathode and then dried, the stresses being seriously different from each other depending on the portions.

The present invention has been made to solve the above problem. It is an object of the present invention to provide an organic electroluminescent device having a sealing structure including a casing and/or a sealing layer. The organic electroluminescent device can be manufactured with high yield in such a manner that electrodes and other components are effectively prevented from being damaged due to stresses caused by the sealing layer and/or the electrodes.

In order to solve the above problem, the present invention provides an organic electroluminescent device including a substrate, a plurality of first electrodes, a partition structure having a plurality of openings located at positions corresponding to the first electrodes, organic functional layers each placed in the corresponding openings, a second electrode disposed over the partition structure and the organic functional layers, and a sealing layer or a sealing member disposed over the second electrode, those components being disposed on or above the substrate. The organic electroluminescent device further includes a stress relief structure including a plurality of island-shaped members arranged along at least one part of outer ends of the partition structure.

According to such a configuration, since the stress relief structure includes the island-shaped members arranged along the outer ends of the partition structure for partitioning pixels, spaces between the island-shaped members serve the same function as that of the openings of the partition structure. Therefore, stresses applied to the second electrode, which is disposed over the partition structure and the organic functional layers, can be distributed, whereby the second electrode is prevented from being damaged due to the stresses.

When the sealing layer is formed to cover the second electrode, a liquid material for forming the sealing layer is applied onto the second electrode and then dried. The sealing layer shrinks in the drying step, whereby stresses are applied to the second electrode and the partition structure. For known organic electroluminescent devices, different stresses are applied to inner regions having opening portions and outer regions having no opening portions; hence, the second electrode can be damaged in some cases. In the present invention, the island-shaped members arranged outside the partition structure reduce stresses applied to the sealing layer in the drying step, whereby the second electrode can be prevented from being damaged. Thus, the organic electroluminescent device is superior in reliability and can be manufactured with high yield.

In the organic electroluminescent device of the present invention, the island-shaped members are preferably arranged around the partition structure. According to such a configuration, stresses applied to the second electrode or the sealing layer can be effectively reduced, whereby the second electrode is securely prevented from being damaged.

In the organic electroluminescent device, the partition structure may have substantially a rectangular shape when viewed from above and the island-shaped members may be arranged along two edges of the partition structure that face each other.

When portions of the second electrode that are close to a specific edge of the partition structure having a rectangular shape can be susceptible to damage, such a configuration may be employed.

In the organic electroluminescent device, the island-shaped members may be arranged along edges of the partition structure that are substantially parallel to the longitudinal direction of the openings.

The inventors have found that in the case that the openings have an elliptic or rectangular shape when viewed from above, edges of the partition structure that extend in parallel to the longitudinal direction of the openings are susceptible to damage due to the stresses. Since the island-shaped members are arranged along such edges of the partition structure, the above damage can be securely prevented.

In the organic electroluminescent device, the island-shaped members preferably each have one or more recessed portions present in the tops thereof.

According to such a configuration, since a portion or portions of a material for forming the sealing layer are placed in the one or more recessed portions when the sealing layer is formed over the island-shaped members, the sealing layer is securely fixed to the island-shaped members, whereby the stresses applied to the partition structure can be reduced.

In the organic electroluminescent device, the one or more recessed portions preferably contain an organic material for forming the organic functional layers. According to such a configuration, since the one or more recessed portions containing the organic material are arranged outside an area containing the openings for forming organic EL elements, the organic material can be effectively prevented from being unevenly dried when the organic functional layers are formed by a liquid phase process. Therefore, the organic electroluminescent device is uniform in brightness.

In the organic electroluminescent device, the one or more recessed portions preferably have a depth less than the height of the island-shaped members. That is, it is preferable that the one or more recessed portions do not extend through the island-shaped members. This is because an insulating layer and/or an element section placed under the island-shaped members can be damaged in some cases if the one or more recessed portions extend through the island-shaped members. Since the one or more recessed portions have a small depth, the organic material can be prevented from being unevenly dried even if the amount of the organic material used is small. Furthermore, the amount of the organic material flowing into the one or more recessed portions is small, which is cost-effective.

In the organic electroluminescent device, the island-shaped members may be arranged at a pitch that is substantially the same as the pitch between the openings arranged in the longitudinal direction.

According to such a configuration, the organic material can be provided in the recessed portions in a step of providing the organic material in the openings. Therefore, it is not necessary to control droplets in an additional step. This simplifies manufacturing steps.

Since the island-shaped members uniformly distribute stresses in a plane, local damage can be prevented.

In the organic electroluminescent device, the lateral length of the island-shaped members arranged in a direction may be substantially the same as the longitudinal length of the openings.

In the organic electroluminescent device, the island-shaped members preferably taper off toward outer ends of the substrate when viewed from above. The island-shaped members according to the present invention distribute stress caused by the shrinkage of the sealing layer to protect the partition structure. Therefore, the island-shaped members most preferably have a shape that is axially symmetric with respect to lines extending in the shrinking directions when viewed from above. Since the island-shaped members have a tapered shape as described above, an advantage in distributing stress can be achieved.

In the organic electroluminescent device, the island-shaped members preferably taper off in the direction of the normal to the substrate when viewed from side. According to such a configuration, the stress caused by the shrinkage of the sealing layer can be effectively distributed.

In the organic electroluminescent device, the island-shaped members preferably have a height greater than or equal to that of the partition structure. When the height of the island-shaped members is less than that of the partition structure, the stress due to the sealing layer disposed above the island-shaped members is directly applied to the partition structure; hence, the partition structure and the organic electroluminescent device are susceptible to damage. However, this configuration is suitable for effectively protecting the partition structure and other components.

In the organic electroluminescent device, the island-shaped members and the partition structure are preferably made of the same material. According to such a configuration, the island-shaped members can be formed in a step of forming the partition structure as well as in a step of forming a known pattern. Therefore, the organic electroluminescent device that can display a high-quality image and has high reliability can be manufactured without increasing the number of manufacturing steps.

An electronic apparatus of the present invention includes the organic electroluminescent device described above. The electronic apparatus has a display section which can display a high-quality image and which has high reliability.

BRIEF DESCRIPTION OF THE DRAWINGS

FIG. 5A and FIG. 5B are enlarged views showing a principal part of FIG. 3.

DETAILED DESCRIPTION OF EMBODIMENTS

The present invention will be further illustrated in detail with embodiments, which are provided to illustrate the present invention but are not intended to limit the scope of the invention. Modifications may be made within the scope of the present invention. In the drawings below, in order to show layers and members on a recognizable scale, different scales are used depending on the size of the layers and members.

[First Embodiment]

Figure 1:
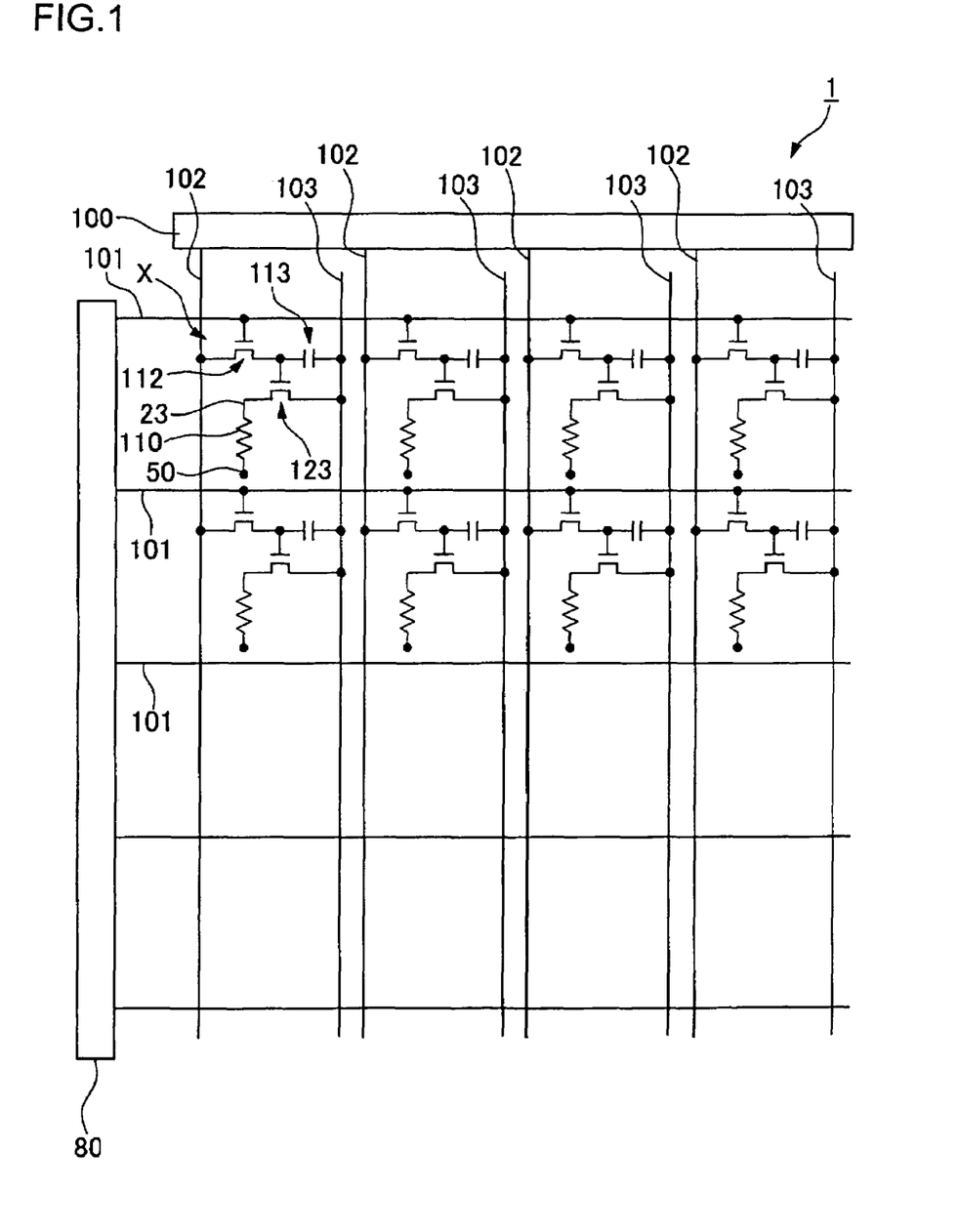
FIG. 1 is a schematic wiring diagram of an organic EL device according to a first embodiment of the present invention.

An organic electroluminescent device (organic EL device) according to a first embodiment of the present invention is described below. FIG. 1 is a schematic wiring diagram of the organic EL device. With reference to FIG. 1, reference numeral 1 represents the organic EL device.

The organic EL device 1 includes thin-film transistors (TFTs) functioning as switching elements and is referred to as an active matrix type. The organic EL device 1 has a wire system including a plurality of scanning lines 101, a plurality of signal lines 102 extending to intersect the scanning lines 101 at a right angle, and a plurality of power supply lines 103 extending in parallel to the signal lines 102 and includes a plurality of pixel regions X each placed adjacent to corresponding intersects of the scanning lines 101 and the signal lines 102.

The signal lines 102 are connected to a data line-driving circuit 100 including a shift register, a level shifter, a video line, and an analog switch. The scanning lines 101 are connected to a scanning line-driving circuit 80 including a shift register and a level shifter.

The pixel regions X each include corresponding switching TFTs 112 having gate electrodes to which scanning signals are transmitted through the scanning lines 101, hold capacitors 113 for holding pixel signals transmitted from the signal lines 102 through the switching TFTs 112, driving TFTs 123 having gate electrodes to which the pixel signals held in the hold capacitors 113 are transmitted, pixel electrodes 23 into which driving currents flow through the power supply lines 103 when the pixel electrodes 23 are electrically coupled to the power supply lines 103 through the driving TFTs 123, and functional layers 110 each placed between the corresponding pixel electrodes 23 and a cathode (counter electrodes) 50. The cathode 50, the pixel electrodes 23, and the functional layers 110 form respective light-emitting elements, that is, organic EL elements.

In the organic EL device 1 having the above configuration, when the switching TFTs 112 are turned on by driving the scanning lines 101, the potentials of the signal lines 102 are held in the hold capacitors 113 and the driving TFTs 123 are turned on or off depending on the potentials of the hold capacitors 113. Currents flow into the pixel electrodes 23 from the power supply lines 103 through channels of the driving TFTs 123 and then flow into the common cathode 50 through the functional layers 110. This allows the functional layers 110 to emit light depending on the amounts of the currents flowing therethrough.

Figure 2:
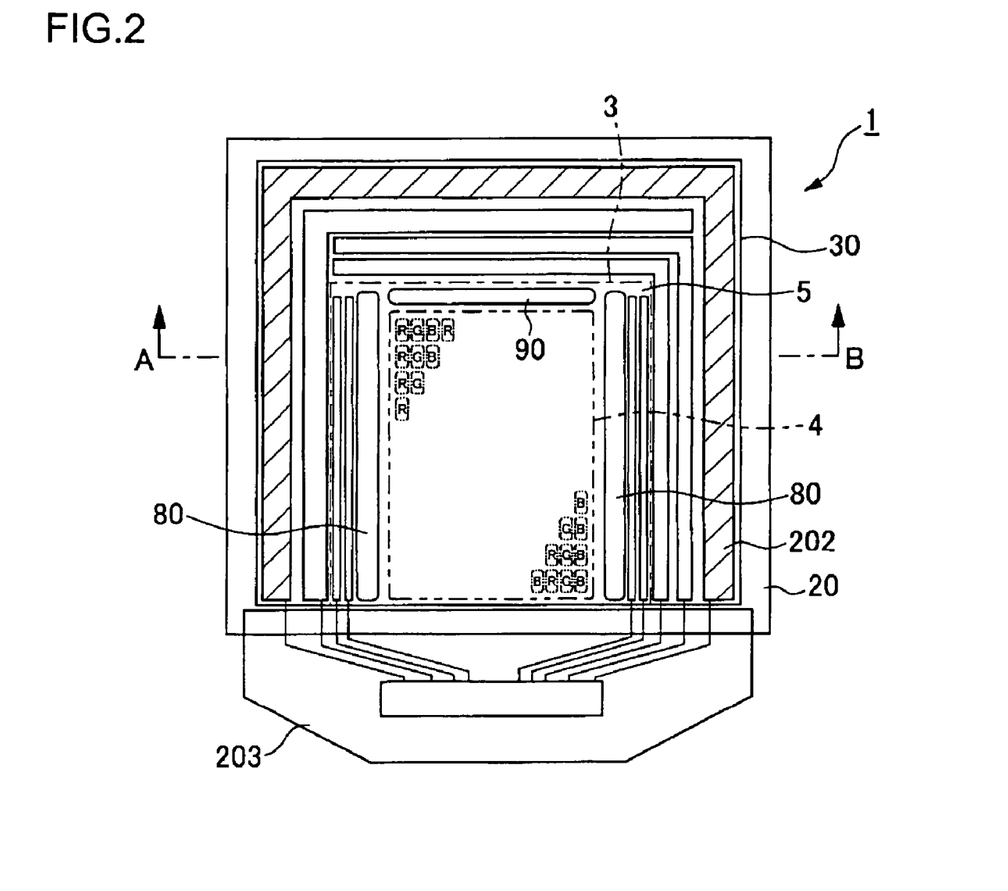
FIG. 2 is a plan view showing a configuration of the organic EL device.
Figure 3:
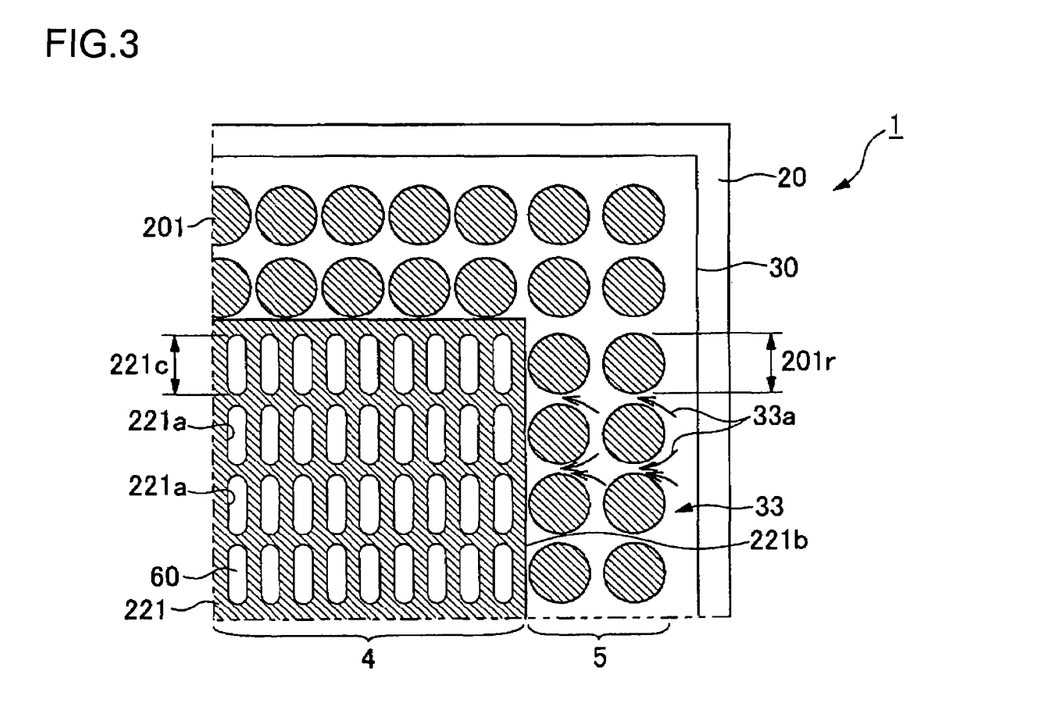
FIG. 3 is an enlarged plan view showing a principal part of FIG. 2.
Figure 4:
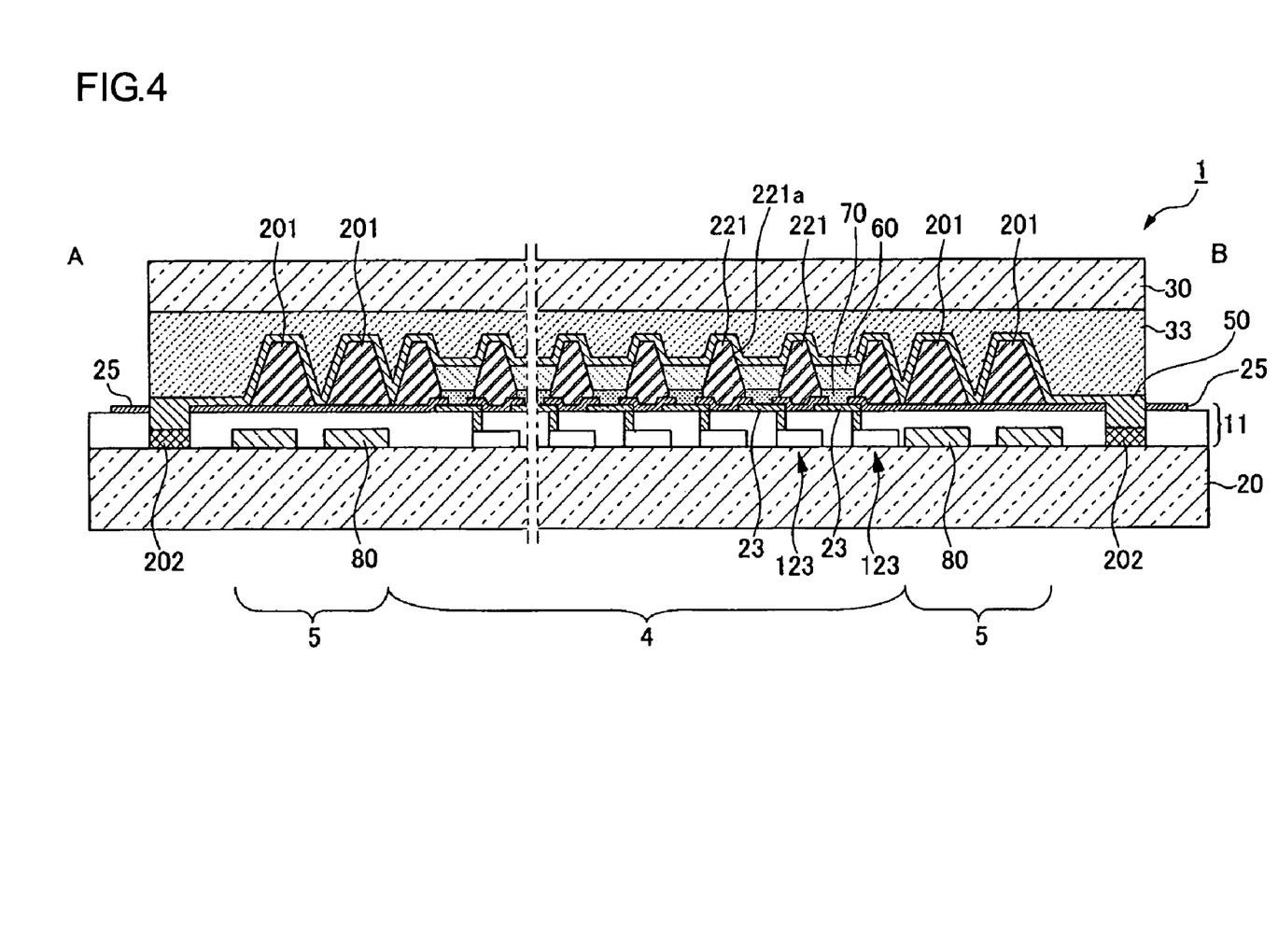
FIG. 4 is a sectional view taken along the line A-B of FIG. 2.
Figure 5A:
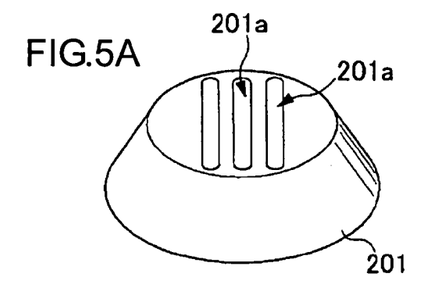
FIG. 5A is a perspective view showing an island-shaped member.
Figure 5B:
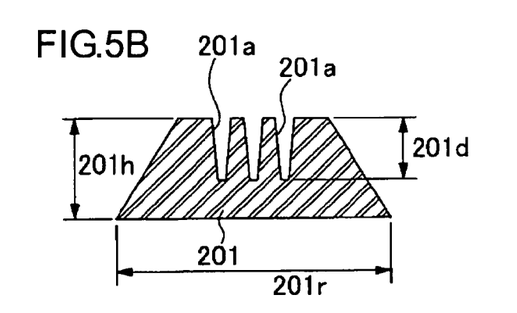
FIG. 5B is a plan view showing the island-shaped member.

A detailed configuration of the organic EL device 1 will now be described with reference to FIGS. 2 to 5. FIG. 2 is a plan view schematically showing a configuration of the organic EL device 1. FIG. 3 is an enlarged plan view showing a principal part of FIG. 2. FIG. 4 is a sectional view taken along the line A-B of FIG. 2. FIG. 5 is an enlarged plan view showing a principal part of FIG. 3.

With reference to FIG. 2, the organic EL device 1 includes a substrate (base member) 20 that is optically transmissive and electrically insulative; a pixel electrode section (not shown) including the pixel electrodes 23, connected to the switching TFTs 112 (not shown), arranged on the substrate 20 in a matrix; and a pixel section 3 (the area surrounded by the one-dotted line in FIG. 2), located above the pixel electrode section, having substantially a square shape when viewed from above. In this embodiment, the pixel section 3 includes two separated sub-sections: an effective display region 4 (the area surrounded by the two-dotted line in FIG. 2) located at the center of FIG. 2 and a dummy region 5 (the region between the one-dotted line and the two-dotted line) extending outside edges of the effective display region 4.

The effective display region 4 includes red display sub-regions R, green display sub-regions G, and blue display sub-regions B, those sub-regions being each connected to the corresponding pixel electrodes 23 and regularly arranged in the direction parallel to the line A-B and also in the direction perpendicular to the line A-B. Scanning line-driving circuits 80 are each place on both sides of the effective display region 4 in FIG. 2. The scanning line-driving circuits 80 are located at a level below the dummy region 5.

An inspection circuit 90 is placed above the effective display region 4 shown in FIG. 2 and located at a level below the dummy region 5. The inspection circuit 90 checks the operation of the organic EL device 1. The inspection circuit 90 includes, for example, an inspection data output member (not shown) for outputting inspection data and can therefore check the quality of display units and defects thereof in manufacturing steps and/or at the time of delivery.

Driving currents are applied to the scanning line-driving circuits 80 and the inspection circuit 90 from a predetermined power supply section through power supply wires, which are not shown. Control signals are transmitted to the scanning line-driving circuits 80 and the inspection circuit 90 from a main driver for controlling the operation of the organic EL device 1 through signal wires, which are not shown. The term "control signal" is defined as a command signal, transmitted from the main driver, for controlling the scanning line-driving circuits 80 and the inspection circuit 90 when those circuits output signals.

A cathode wire 202 extends outside the pixel section 3 and a transparent protective substrate 30 is placed such that the protective substrate 30 corresponds to an area in which the cathode wire 202 extends. With reference to FIG. 4, the protective substrate 30 faces the substrate 20 and a plurality of the light-emitting elements included in the effective display region 4 are arranged between the protective substrate 30 and the substrate 20, as described below in detail.

With reference to FIG. 3, a partition structure 221 having a plurality of openings 221a is placed in a plane region corresponding to the effective display region 4. The dummy region 5 extending outside the partition structure 221 contains a plurality of island-shaped members 201, arranged outside edges of the partition structure 221, having a circular shape when viewed from above. The partition structure 221 and the island-shaped members 201 are placed between the protective substrate 30 and the substrate 20.

In this embodiment, the partition structure 221 and the island-shaped members 201 may be formed on the substrate 20 using a resin material by patterning the substrate 20 and therefore made of the same organic compound such as resin. The partition structure 221 and the island-shaped members 201 may be made of different materials. That is, the partition structure 221 may be made of an organic material and the island-shaped members 201 may be made of an inorganic material such as a silicon dioxide.

The openings 221a arranged in the partition structure 221 each contain corresponding organic light-emitting sub-layers 60 described below and each correspond to the corresponding pixel regions X shown in FIG. 1. The island-shaped members 201 are arranged at a predetermined interval in a separated manner. The diameter 201r of the island-shaped members 201 is substantially the same of the longitudinal length 221c of the openings 221a. Some of the island-shaped members 201 are arranged along edges 221b of the partition structure 221 extending in parallel to the longitudinal direction of the openings 221a and each arranged adjacent to the corresponding openings 221a in the horizontal direction in the figure.

With reference to FIG. 4, the organic EL device 1 has the following configuration in cross section: a large number of the light-emitting elements (organic EL elements) including the pixel electrodes (first electrodes) 23, the organic light-emitting sub-layers 60, and the cathode (second electrode) 50 are arranged on the substrate (base member) 20, a sealing layer 33 is disposed over those components, and the protective substrate (sealing member) 30 is disposed on the sealing layer 33 to seal those components.

The functional layers 110 each include the corresponding organic light-emitting sub-layers (organic functional layers) 60, which are principal sub-layers, and may further include hole injection sub-layers, hole transport sub-layers, electron injection sub-layers, electron transport sub-layers, hole-blocking sub-layers, and electron-blocking sub-layers.

When the organic EL device 1 is of a top emission type, display light is extracted through the protective substrate 30 facing the substrate 20; hence, the substrate 20 may be transparent or opaque. Examples of an opaque substrate include a ceramic sheet made of alumina or the like; a metal sheet, made of stainless steel or the like, electrically insulated by surface oxidation or the like; and a plastic film made of a thermosetting resin or thermoplastic resin. The plastic film is advantageous in impact resistance and weight reduction.

A circuit section 11 including the driving TFTs 123 for driving the pixel electrodes 23 is placed on the substrate 20 and a large number of the light-emitting elements (organic EL elements) are arranged above the circuit section 11. As shown in FIG. 4, the light-emitting elements each include the corresponding pixel electrodes 23 functioning as anodes; corresponding hole injection/transport sub-layers 70 for injecting/transporting holes flowing from the pixel electrodes 23; the corresponding organic light-emitting sub-layers 60 containing an organic electroluminescent material, which is a species of electro-optical material; and the cathode 50, those sub-layers and cathode being arranged on the pixel electrodes 23 in that order. According to such a configuration, holes injected from the hole injection/transport sub-layers 70 are coupled to electrons flowing from the cathode 50 at the organic light-emitting sub-layers 60, whereby the light-emitting elements are allowed to emit light.

In this embodiment, the pixel electrodes 23 need not be transparent because the organic EL device 1 is of a top emission type; hence, the pixel electrodes 23 may be made of any electrically conductive material.

Examples of a material for forming the hole injection/transport sub-layers 70 include polythiophenes, polypyrroles, and a material doped with one of those compounds. In particular, the hole injection/transport sub-layers 70 are formed using a dispersion containing 3,4-polyethylene dioxythiophene and polystyrenesulfonic acid (PEDOT/PSS).

A known luminous material that can emit fluorescence or phosphorescence may be used to form the organic light-emitting sub-layers 60. Preferable examples of such a material include polyfluorenes (PFs), poly(paraphenylene vinylene) derivatives (PPVs), polyphenylenes (PPs), poly-paraphenylenes (PPPs), polyvinylcarbazoles (PVKs), polythiophenes, and polysilanes such as polymethylphenylsilane (PMPSs).

Those polymers may be doped with a high molecular dye such as a perylene dye, a coumarin dye, or a rhodamine dye; a low molecular compound such as rubrene, perylene, 9,10-diphenylanthracene, tetraphenylbutadiene, Nile red, coumarin 6, or quinacridone; or a similar compound.

A conventionally known low molecular dye may be used instead of the high molecular dye described above.

Electron injection layers principally containing a metal compound or metal such as calcium, magnesium, lithium, sodium, strontium, barium, or cesium may each be placed on the corresponding organic light-emitting sub-layers 60.

In this embodiment, as shown in FIG. 4, an inorganic insulating layer 25 having substantially a grid pattern when viewed from above is placed above the substrate 20, and the hole injection/transport sub-layers 70 and the organic light-emitting sub-layers 60 are placed in areas defined by portions of the inorganic insulating layer 25 and portions of the partition structure 221. Each hole injection/transport sub-layer 70 and organic light-emitting sub-layer 60 placed therein form an element layer included in each light-emitting element (organic EL element). The island-shaped members 201 arranged outside the partition structure 221 are located above the scanning line-driving circuits 80 with the inorganic insulating layer 25 placed between the island-shaped members 201 and the scanning line-driving circuits 80.

The inorganic insulating layer 25 has an area larger than the sum of the area of the effective display region 4 and that of the dummy region 5 and extends over outer ends of the substrate 20.

The cathode 50 is placed above the substrate 20 in such a manner that the cathode 50 lies over the organic light-emitting sub-layers 60, the partition structure 221, the upper faces and side faces of the island-shaped members 201, and the partition structure 221. As shown in FIG. 4, portions of the cathode 50 are connected to the cathode wire 202 extending inside the edges of the substrate 20 and outside an area containing the island-shaped members 201. A flexible substrate 203 is joined to the cathode 50 (see FIG. 2). This allows the cathode 50 to be electrically connected to a driving integrated circuit (driving IC), placed on the flexible substrate 203, with the cathode wire 202.

Since the organic EL device 1 is of the top emission type, a material for forming the cathode 50 must be transparent; hence, a transparent, conductive material is preferably used. Typical examples of such a transparent, conductive material include indium tin oxide (ITO) and other transparent, conductive compounds. In this embodiment, ITO is employed.

A cathode-protecting layer (not shown) may be placed above the cathode 50. The cathode-protecting layer has a function of preventing the cathode 50 from being corroded in manufacturing steps and is made of an inorganic compound such as a silicon compound. When the cathode 50 is covered with the cathode-protecting layer made of such an inorganic compound, the cathode 50 can be effectively protected from corrosion due to the contact with oxygen, moisture, an organic compound, and the like. The cathode-protecting layer can be formed by a high-density plasma deposition process using a silicon compound such as silicon nitride, silicon oxide nitride, or silicon dioxide. Alternatively, another compound such as alumina, tantalum oxide, titanium oxide, or another ceramic compound other than the silicon compound can be used. The cathode-protecting layer may have a thickness of about 10 to 300 nm. When the thickness is less than 10 nm, portions of the cathode-protecting layer can have perforations formed due to layer defects and/or a difference in the layer thickness; hence, the cathode-protecting layer has inferior barrier properties. When the thickness is more than 300 nm, cracks due to stress can be formed in the cathode-protecting layer to damage the cathode 50.

The sealing layer 33 is placed on the cathode 50. The area of the sealing layer 33 that covers the cathode 50 is greater than that of the partition structure 221. The sealing layer 33 extends close to outer ends of the substrate 20. The protective substrate 30 is placed on the sealing layer 33 and joined to the substrate 20 with the sealing layer 33 disposed therebetween.

The sealing layer 33 blocks the entry of oxygen and moisture and therefore prevents oxygen and moisture from entering the cathode 50 and the organic light-emitting sub-layers 60, which are thereby prevented from being damaged by oxygen and moisture. The sealing layer 33 preferably has a function of absorbing mechanical impact applied from outside.

In this embodiment, since the organic EL device 1 is of the top emission type, the sealing layer 33 must be transparent as described above. Therefore, the sealing layer 33 is allowed to have a transmittance of 80% or more for light in the visible range by selecting a material therefor and/or adjusting the thickness.

The sealing layer 33 is made of a resin material such as a urethane resin, an acrylic resin, an epoxy resin, or a polyolefin and functions as an adhesive member that is more flexible than protective substrate 30 and has a glass transition point less than that of the protective substrate 30 as described below. Such a resin material preferably contains a silane coupling agent or alkoxysilane. This allows the sealing layer 33 to be securely joined to the protective substrate 30, which is thereby allowed to have an enhanced function of absorbing mechanical impact.

The sealing layer 33 can be formed as follows: the resin material in a liquid state is applied onto the substrate 20 by a spin coating process, the protective substrate 30 is placed on the resulting substrate 20, and the protective substrate 30 and the substrate 20 are then dried. This allows the protective substrate 30 and the substrate 20 to be securely joined to each other.

The protective substrate 30 as well as the sealing layer 33 functions as a member for sealing the organic EL device 1 and has at least one of a dielectric function, a wear resistant function, a function of preventing the reflection of external light, a gas barrier function, an ultraviolet-shielding function. In particular, examples of the protective substrate 30 include a glass substrate and a plastic film coated with a diamond-like carbon (DLC) layer, a silicon oxide layer, or a titanium oxide layer.

Since the organic EL device 1 is of the top emission type, the protective substrate 30 and the sealing layer 33 must be transparent; however, when the organic EL device 1 is of a bottom emission type, the protective substrate 30 and the sealing layer 33 need not be transparent.

The organic EL device 1 having the above configuration includes a stress relief structure including the island-shaped members 201 arranged outside the partition structure 221 that defines the effective display region 4. This allows the partition structure 221 and the cathode 50 disposed over the partition structure 221 and the island-shaped members 201 to be prevented from being damaged. Functions and advantages of the stress relief structure will now be described with reference to FIG. 3.

In this embodiment, the sealing layer 33 is formed by applying the liquid resin material onto the substrate 20 and then curing the resulting material in a drying step. The liquid resin material shrinks from outer ends of the substrate 20 toward the center thereof in the drying step. Therefore, portions of the sealing layer 33 have different thicknesses and suffer from different stresses due to the shrinkage.

In the drying step, particularly strong stresses are applied to the edges 221b of the partition structure 221 that provide steps on the substrate 20. If no measures are taken for the portions suffering from the strong stresses, cracks can be formed in the cathode 50 to cause faulty electrical continuity, which leads to a difference in display brightness, or the organic EL device 1 can be damaged in some cases.

In the present invention, in order to prevent the sealing layer 33 from being damaged due to the stresses, the island-shaped members 201 are arranged outside the partition structure 221 in a dotted manner to form the stress relief structure. According to the stress relief structure, as shown in FIG. 3, shrinking directions 33a that the sealing layer 33 shrinks in the drying step are changed by the island-shaped members 201, whereby stresses can be prevented from being applied to the whole of the edges 221b of the partition structure 221. The stresses are reduced due to the elasticity of the island-shaped members 201 to a certain extent; hence, the stresses applied to some parts of the edges 221b are also reduced, whereby the partition structure 221 and the cathode 50 can be effectively prevented from being damaged. Therefore, in the organic EL device 1, no faulty continuity is caused in the cathode 50, whereby an image with uniform brightness can be displayed. The organic EL elements can be prevented from being damaged by the stresses due to the sealing layer 33 in manufacturing steps; hence, the organic EL device 1 can be manufactured with high yield.

FIG. 5(a) is a perspective view showing one of the island-shaped members 201 shown in FIG. 3 or 4 and FIG. 5(b) is a sectional view showing the island-shaped member 201. As shown in FIGS. 5(a) and 5(b), the island-shaped members 201 have substantially a frusto-conical shape and are arranged above the substrate 20 (that is, on the inorganic insulating layer 25). A plurality of slits (recessed portions) 201a are arranged in the top face of each island-shaped member 201 (the figures show three of the slits 201a arranged therein in). The slits 201a extend in parallel to each other. In this embodiment, the slits 201a extend substantially in parallel to the longitudinal direction of the openings 221a. Since the liquid material for forming the sealing layer 33 flows into the slits 201a when the liquid material is provided by an application process, the sealing layer 33 is fixed to the island-shaped members 201, whereby stresses applied to the partition structure 221 can be reduced in the step of curing the material for forming the sealing layer 33.

When the organic light-emitting sub-layers 60 and the hole injection/transport sub-layers 70, which are organic functional layers, are formed by a liquid phase process such as a droplet ejection process, the slits 201a prevent those organic functional layers from being unevenly dried. When the organic functional layers are formed, a first liquid material for forming the hole injection/transport sub-layers 70 and a second liquid material for forming the organic light-emitting sub-layers 60 are provided in the openings 221a of the partition structure 221 in that order by the droplet ejection process. In this step, if the liquid materials are not provided in the openings 221a, there is a problem in that pieces of the liquid materials placed in some of the openings 221a that are arranged close to edges of the partition structure 221 are dried in a short time; hence, such pieces are unevenly dried. However, in the present invention, the liquid materials are provided in the openings 221a by the droplet ejection process, pieces of the liquid materials placed in some of the openings 221a that are arranged close to the edges of the partition structure 221 can be prevented from being rapidly dried. Therefore, the organic functional layers can be formed in the effective display region 4 in such a manner that the liquid materials are uniformly dried. Since the liquid materials are provided in the openings 221a in the above manner, the slits 201a are preferably arranged at a pitch that is substantially the same as that between the openings 221a. This is because the control of a head for discharging droplets is prevented from being complicated.

A procedure for forming the organic light-emitting sub-layers 60 and the hole injection/transport sub-layers 70 by the droplet ejection process (inkjet process) is known and disclosed in Patent Document 1 described above.

In this embodiment, the island-shaped members 201 has substantially a frusto-conical shape as described above; however, the shape of the island-shaped members 201 is not limited thereto. The island-shaped members 201 may have any shape and any one of, for example, a circular shape, an elliptical shape, a rectangular shape, and a polygonal shape when viewed from above. In order to securely achieve an advantage in distributing the shrinking stresses described above, the island-shaped members 201 are preferably tapered in such directions that the sealing layer 33 shrinks, that is, tapered toward outer ends of the substrate 20. Alternatively, the island-shaped members 201 may have a semi-circular shape or a triangular shape in cross section other than a trapezoidal shape as shown in FIG. 5(b). In view of such an advantage in distributing the shrinking stresses and in view of an advantage in manufacture, the island-shaped members 201 are preferably tapered in cross section in the direction perpendicular to the substrate 20.

In this embodiment, the partition structure 221 is surrounded by two rows of the island-shaped members 201. The arrangement of the island-shaped members 201 may be arbitrarily varied. When the openings 221a arranged in the partition structure 221 have substantially an elliptic shape (or a rectangular shape) as shown in FIG. 3, the partition structure 221 has portions readily damaged by stresses due to the sealing layer 33 and such portions correspond to parts of the edges 221b extending in parallel to the longitudinal direction of the openings 221a shown in FIG. 3. Therefore, in such a configuration, the island-shaped members 201 may be arranged only along the edges 221b. However, when the openings 221a have, for example, an isotropic shape such as a square shape or a circular shape, all the edges of the partition structure 221 can be damaged; hence, the island-shaped members 201 are preferably arranged along all the edges thereof.

The height 201h of the island-shaped members 201 shown in FIG. 5 is preferably greater than or equal to that of the partition structure 221 shown in FIG. 4. When the height 201h of the island-shaped members 201 is less than that of the partition structure 221, large shrinking stresses are applied to edges of the partition structure 221 and the organic EL device 1 can therefore be damaged in some cases. The depth 201d of the slits 201a is preferably less than the height 201h of the island-shaped members 201. When the slits 201a extend through the island-shaped members 201 to the inorganic insulating layer 25, the inorganic insulating layer 25 and the circuit section 11 can be damaged in an etching step of forming the slits 201a in some cases, which is not preferable.

Since the slits 201a are used to prevent the uneven drying described above, it is cost-effective that the slits 201a have a small depth because of the following reasons: the amount of the liquid materials, provided in the slits 201a, for forming the organic light-emitting sub-layers 60 and the hole injection/transport sub-layers 70 is small; the uneven drying can be prevented because the amount of the liquid materials used is small; and the amount of the liquid material, entering the slits 201a, for forming the sealing layer 33 is also small.

In order to allow the slits 201a to have a depth less than the height 201h of the island-shaped members 201, so-called half-exposure may be performed as follows: a smaller amount of energy rays are selectively applied to regions for forming the slits 201a as compared with the amount of the energy rays applied to other regions when the island-shaped members 201 are formed by a photolithographic process.

In this embodiment, the following configuration is described above: a sealed configuration in which, in order to seal the organic EL elements arranged on the substrate 20, the protective substrate 30 is joined to the substrate 20 with the sealing layer 33, placed therebetween, functioning as an adhesive member. The stress relief structure placed in the organic EL device 1 according to the present invention functions well if the stress relief structure is placed in an organic EL device having another sealed configuration. Examples of the sealed configuration include a configuration in which a box-shaped sealing cap is placed over the cathode 50 lying over the partition structure 221; a configuration in which a sealing cap similar to the above one is placed over the cathode-protecting layer, described above, containing an inorganic material or an organic material; and other configurations. For those configurations, a space is present between the cathode 50 or the cathode-protecting layer and a sealing cap separated therefrom; hence, stresses applied to the cathode 50 and the partition structure 221 are slight. Since the cathode 50 and the cathode-protecting layer contain stresses, large-sized panels are at increased risk of suffering from cracks due to such stresses. The stresses contained in the cathode 50 and the cathode-protecting layer can be reduced by the use of the stress relief structure according to the present invention, whereby the organic EL elements arranged on the substrate 20 are prevented from being damaged.

A cross-sectional configuration of the organic EL device 1 will now be described in detail.

The circuit section 11 is disposed below the pixel electrodes 23 and other components as shown in FIG. 4, from which details of the circuit section 11 are omitted. The details of the circuit section 11 are described below with reference to FIG. 6, which is a fragmentary sectional view showing the organic EL device 1 including the circuit section 11.

Figure 6:
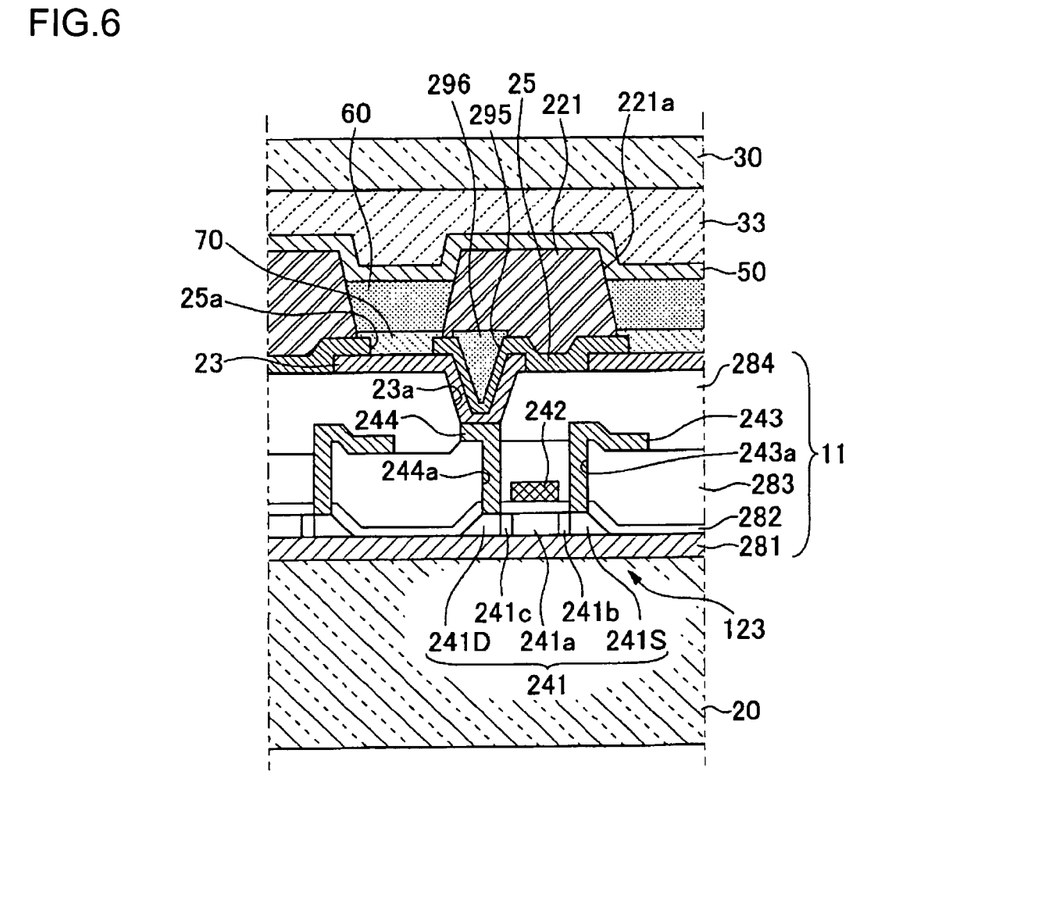
FIG. 6 is a fragmentary sectional view showing a configuration of the organic EL device including a circuit section.

A substrate-protecting layer 281, principally containing $SiO_2$, functioning as a base layer is placed on the substrate 20 and silicon layers 241 are arranged on the substrate-protecting layer 281. A gate insulating layer 282 principally containing $SiO_2$ and/or SiN is placed above the substrate 20 including the silicon layers 241.

The silicon layers 241 each include corresponding channel regions 241a, which are each placed below corresponding gate electrodes 242 with the gate insulating layer 282 extending therebetween. The gate electrodes 242 are portions of the scanning lines 101, which are not shown. A first interlayer insulating layer 283 is disposed on the gate insulating layer 282, disposed over the silicon layers 241, having the gate electrodes 242 thereon and principally contains a silicon compound such as silicon dioxide or silicon nitride. The interlayer insulating layer 283 can be formed by a plasma CVD process or a similar process using a source gas mixture such as a gas mixture of monosilane and nitrous oxide, a gas mixture of tetraethoxysilane (TEOS) represented by the formula $Si(OC_2H_5)_4$ and oxygen, or a gas mixture of disilane and ammonia.

The silicon layers 241 each include corresponding lightly doped source regions 241b and heavily doped source regions 241S both located on the source side of the channel regions 241a and also include corresponding lightly doped drain regions 241c and heavily doped drain regions 241D both located on the drain side of the channel regions 241a. That is, the driving TFTs 123 have a lightly doped drain (LDD) structure. The heavily doped source regions 241S are electrically connected to source electrodes 243 with first contact holes 243a extending through the gate insulating layer 282 and interlayer insulating layer 283. The source electrodes 243 are portions of the power supply lines 103 (see FIG. 1), which extend perpendicular to the plane of FIG. 6 at the positions of the source electrodes 243. The heavily doped drain regions 241D are electrically connected to drain electrodes 244, prepared by processing a layer used to prepare the source electrodes 243, with second contact holes 244a extending through the gate insulating layer 282 and interlayer insulating layer 283.

A second interlayer insulating layer 284 is disposed over the interlayer insulating layer 283 having the source electrodes 243 and drain electrodes 244 thereon and principally contains a silicon compound, such as silicon nitride, silicon dioxide, or silicon nitride oxide, having high gas barrier properties. The second interlayer insulating layer 284 includes, for example, a silicon compound sub-layer containing silicon nitride, silicon dioxide, or a similar compound and a wire-flattening sub-layer containing an acrylic resin or a similar resin. The pixel electrodes 23 containing ITO are arranged on the second interlayer insulating layer 284 and electrically connected to the drain electrodes 244 with third contact holes 23a extending through the second interlayer insulating layer 284. That is, the pixel electrodes 23 are electrically connected to the heavily doped drain regions 241D of the silicon layers 241 with the drain electrodes 244.

After the pixel electrodes 23 are each formed in the corresponding third contact holes 23a, recessed sections 295 remain in the third contact holes 23a depending on the depth of the third contact holes 23a. Therefore, organic flat layers 296 are provided in the recessed sections 295 to fill the recessed sections 295, thereby forming a flat face. The organic flat layers 296 preferably contain an acrylic resin or an organic silicon compound. Since a base area under the partition structure 221 is flat, the cathode 50 and sealing layer 33 disposed over the partition structure 221 are also flat. Therefore, the sealing layer 33 has high sealing properties.

TFTs (driving circuit TFTs) placed in the scanning line-driving circuits 80 and the inspection circuit 90, that is, n- or p-channel type TFTs included in an inverter placed in a shift register have substantially the same configuration as that of the driving TFTs 123 except that the former TFTs are not connected to the pixel electrodes 23.

Portions of the pixel electrodes 23, the inorganic insulating layer 25, and the partition structure 221 are placed on the second interlayer insulating layer 284 in which the pixel electrodes 23 extend. The inorganic insulating layer 25 contains, for example, an inorganic compound such as $SiO_2$. The partition structure 221 contains, for example, an organic material such as an acrylic resin or polyimide. Apertures 25a are arranged in the inorganic insulating layer 25. The apertures 25a and the openings 221a arranged in the partition structure 221 are located on the pixel electrodes 23 in that order to form spaces. The hole injection/transport sub-layers 70 and the organic light-emitting sub-layers 60 are placed in the spaces in that order, that is, the hole injection/transport sub-layers 70 and the organic light-emitting sub-layers 60 are placed on the pixel electrodes 23 in that order.

The components and layers, described above, placed between the second interlayer insulating layer 284 and the substrate 20 form the circuit section 11.

In this embodiment, in order to allow the organic EL device 1 to display a color image, the organic light-emitting sub-layers 60 emit light with wavelengths corresponding to the three primary colors. The organic light-emitting sub-layers 60 are categorized into three types: red organic light-emitting sub-layers that emit light with wavelengths corresponding to red, green organic light-emitting sub-layers that emit light with wavelengths corresponding to green, and blue organic light-emitting sub-layers that emit light with wavelengths corresponding to blue. The red organic light-emitting sub-layers, the green organic light-emitting sub-layers, and the blue organic light-emitting sub-layers are placed in the red, green, and blue display sub-regions R, G, and B, respectively. Each red display sub-region R, green display sub-region G, and blue display sub-region B form one pixel for displaying a color image. A black matrix (BM), which is not shown, is placed between, for example, the partition structure 221 and the inorganic insulating layer 25 in such a manner that lines of the black matrix are aligned with boundaries between the red, green, and blue display sub-regions R, G, and B.

[Second Embodiment]

Figure 7:
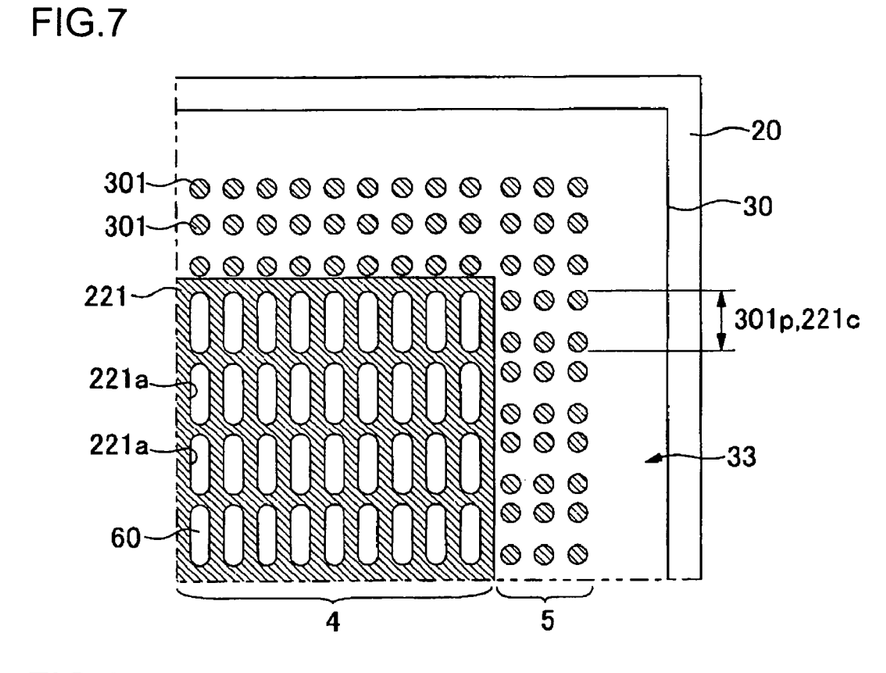
FIG. 7 is a plan view showing a configuration of an organic EL device according to a second embodiment of the present invention.

A second embodiment of the present invention will now be described with reference to FIG. 7, which is a plan view showing a principal part of an organic EL device according to this embodiment and corresponds to FIG. 3 for illustrating the first embodiment.

The organic EL device of the second embodiment includes a partition structure 221 and island-shaped members 301 arranged therearound, and the size and pitch of the island-shaped members 301 are different from those of the island-shaped members 201 described in the first embodiment. Other components and members of the organic EL device of the second embodiment are the same as those described in the first embodiment. The components and members shown in FIG. 7 have the same reference numerals as those of the components and members shown in FIG. 3.

In the organic EL device of this embodiment, the island-shaped members 301 arranged around the partition structure 221 has a diameter smaller than that of the island-shaped members 201 of the first embodiment and a circular shape when viewed from above. The partition structure 221 has openings 221a having a length represented by reference numeral 221c. The island-shaped members 301 are arranged in parallel to the longitudinal direction of the openings 221a. The outer distance between a pair of the island-shaped members 301 adjacent to each other is substantially equal to the length 221c of the openings 221a and the pitch between pairs of the island-shaped members 301 is the same as that between the openings 221a.

In the organic EL device according to the second embodiment having the above configuration, as well as the organic EL device 1 of the first embodiment, the partition structure 221 and organic EL elements can be prevented from being damaged due to stresses applied to sealing layer 33. Therefore, the organic EL device of the second embodiment is uniform in brightness and can be manufactured with high yield.

Since a large number of the island-shaped members 301 with a relatively small size are arranged, the stresses applied to the sealing layer 33 can be effectively distributed, whereby the island-shaped members 301 and a cathode 50 placed thereon are prevented from being damaged.

Since rows and columns of the island-shaped members 301 are aligned with rows and columns of the openings 221a as described above, there is an advantage in that a head for discharging droplets can be readily controlled when liquid materials for forming organic functional layers are provided in slits arranged in the island-shaped members 301.

[Electronic Apparatus]

Figure 8:
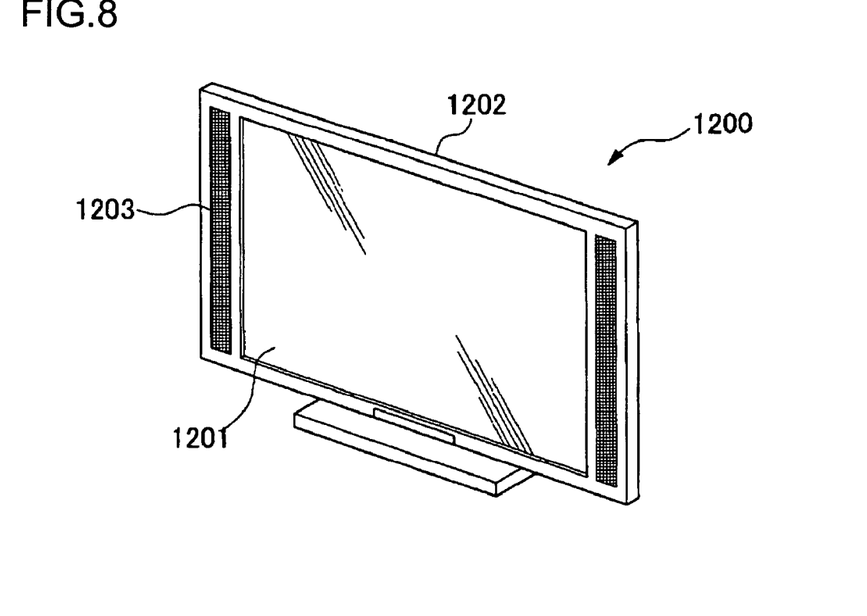
FIG. 8 is a perspective view showing a configuration of an electronic apparatus.

FIG. 8 is a perspective view showing a configuration of a thin large-screen television 1200 that is an example of an electronic apparatus according to the present invention. The thin large-screen television 1200 shown in this figure principally includes a display section 1201 including the organic EL device according to the first or second embodiment, a housing 1202, and an audio output section 1203 including a speaker. The thin large-screen television 1200 displays an image with uniform brightness due to the organic EL device and the display section 1201 is superior in reliability.

An organic EL device of the present invention is fit for display sections of various electronic apparatuses such as portable electronic apparatuses and personal computers, other than the display section 1201 shown in FIG. 8.

What is claimed is:

1. An organic electroluminescent device comprising:
   a substrate;
   a plurality of first electrodes disposed on or above the substrate;
   a partition structure having a plurality of openings located at positions corresponding to the first electrodes, the partition structure being disposed on or above the substrate;
   organic functional layers each placed in the corresponding openings;
   a second electrode disposed over the partition structure and the organic functional layers;
   a sealing layer or a sealing member disposed over the second electrode; and
   a stress relief structure including a plurality of island-shaped members arranged along at least one part of outer ends of the partition structure.

2. The organic electroluminescent device according to claim 1, wherein the island-shaped members are arranged around the partition structure.

3. The organic electroluminescent device according to claim 1, wherein the partition structure has substantially a rectangular shape when viewed from above and the island-shaped members are arranged along two edges of the partition structure that face each other.

4. The organic electroluminescent device according to claim 1, wherein the island-shaped members are arranged along edges of the partition structure that are substantially parallel to the longitudinal direction of the openings.

5. The organic electroluminescent device according to claim 1, wherein the island-shaped members each have one or more recessed portions present in the tops thereof.

6. The organic electroluminescent device according to claim 5, wherein the one or more recessed portions contain an organic material for forming the organic functional layers.

7. The organic electroluminescent device according to claim 5, wherein the one or more recessed portions have a depth less than the height of the island-shaped members.

8. The organic electroluminescent device according to claim 1, wherein the island-shaped members are arranged at a pitch that is substantially the same as the pitch between the openings arranged in the longitudinal direction.

9. The organic electroluminescent device according to claim 1, wherein the lateral length of the island-shaped members arranged in a direction is substantially the same as the longitudinal length of the openings.

10. The organic electroluminescent device according to claim 1, wherein the island-shaped members taper off toward outer ends of the substrate when viewed from above.

11. The organic electroluminescent device according to claim 1, wherein the island-shaped members taper off in the direction of the normal to the substrate when viewed from side.

12. The organic electroluminescent device according to claim 1, wherein the island-shaped members have a height greater than or equal to that of the partition structure.

13. The organic electroluminescent device according to claim 1, wherein the island-shaped members and the partition structure are made of the same material.

14. An electronic apparatus comprising the organic electroluminescent device according to claim 1.

15. An organic electroluminescent device comprising:
    a plurality of first electrodes;
    a partition structure having a plurality of openings located at positions corresponding to the first electrodes;
    a plurality of island-shaped members arranged along at least one part of outer ends of the partition structure;
    organic functional layers each placed in the corresponding openings;
    a second electrode disposed over the partition structure and the organic functional layers; and
    a sealing layer or a sealing member disposed over the second electrode, the island-shaped members and the partition structure are made of the same material.

16. The organic electroluminescent device according to claim 15, the second electrode being formed over the plurality of island-shaped members.

17. The organic electroluminescent device according to claim 15, the sealing layer or the sealing member being formed over the plurality of island-shaped members.

* * * * *

UNITED STATES PATENT AND TRADEMARK OFFICE
CERTIFICATE OF CORRECTION

PATENT NO.         : 7,323,817 B2                                          Page 1 of 1
APPLICATION NO. : 11/042139
DATED              : January 29, 2008
INVENTOR(S)        : Kozo Shitagami and Ryoichi Nozawa

It is certified that error appears in the above-identified patent and that said Letters Patent is hereby corrected as shown below:

In claim 8:
    Col. 16, line 4, change "openings arranged in the longitudinal direction" to --openings in a longitudinal direction of the openings--.

In claim 9:
    Col. 16, line 8, change "the longitudinal length" to --a longitudinal length--.

Signed and Sealed this

Nineteenth Day of August, 2008

JON W. DUDAS
*Director of the United States Patent and Trademark Office*